(12) United States Patent
Lim et al.

(10) Patent No.: US 11,778,745 B2
(45) Date of Patent: Oct. 3, 2023

(54) FLEXIBLE CIRCUIT BOARD AND DISPLAY DEVICE INCLUDING THE SAME

(71) Applicant: Samsung Display Co., Ltd., Yongin-si (KR)

(72) Inventors: Seungjin Lim, Hwaseong-si (KR); Chung-Seok Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 563 days.

(21) Appl. No.: 16/896,014

(22) Filed: Jun. 8, 2020

(65) Prior Publication Data

US 2021/0022248 A1 Jan. 21, 2021

(30) Foreign Application Priority Data

Jul. 17, 2019 (KR) .................. 10-2019-0086582

(51) Int. Cl.
*H05K 1/11* (2006.01)
*H05K 1/14* (2006.01)
*H05K 1/18* (2006.01)
*G02F 1/1345* (2006.01)
*H10K 59/131* (2023.01)

(52) U.S. Cl.
CPC ......... *H05K 1/147* (2013.01); *G02F 1/13458* (2013.01); *H05K 1/111* (2013.01); *H05K 1/189* (2013.01); *G02F 1/13452* (2013.01); *G02F 2202/28* (2013.01); *H05K 2201/056* (2013.01); *H05K 2201/10128* (2013.01); *H05K 2201/10136* (2013.01); *H10K 59/131* (2023.02)

(58) Field of Classification Search
CPC ............ G02F 1/13458; G02F 1/13452; G02F 2202/28; H05K 1/111; H05K 1/189; H05K 2201/10128; H01L 27/3276
See application file for complete search history.

(56) References Cited

U.S. PATENT DOCUMENTS

| | | | |
|---|---|---|---|
| 2013/0141912 A1* | 6/2013 | Kim ...................... | H05K 3/363 |
| | | | 362/249.02 |
| 2015/0171151 A1* | 6/2015 | Chae .................... | H10K 59/131 |
| | | | 438/151 |
| 2018/0143482 A1* | 5/2018 | Jin ........................ | G06F 1/1643 |
| 2019/0074332 A1 | 3/2019 | Kim et al. | |
| 2021/0351262 A1 | 11/2021 | Kim et al. | |

FOREIGN PATENT DOCUMENTS

| | | |
|---|---|---|
| JP | 2003-273476 | 9/2003 |
| JP | 2007-034148 | 2/2007 |
| KR | 10-2019-0026497 | 3/2019 |
| KR | 10-2020-0018749 | 2/2020 |

* cited by examiner

*Primary Examiner* — Towfiq Elahi
(74) *Attorney, Agent, or Firm* — H.C. Park & Associates, PLC

(57) ABSTRACT

A display device includes: a display panel including a plurality of display pads each extending in a first direction and arranged in a second direction crossing the first direction; a main circuit board; and a flexible circuit board including: board pads connected to the display pads; and a floating pattern spaced apart from the board pads, the floating pattern connected to the display panel by an anisotropic conductive film (ACF), wherein at least a portion of the floating pattern does not overlap with the ACF in plan view.

18 Claims, 12 Drawing Sheets

FLEXIBLE CIRCUIT BOARD AND DISPLAY DEVICE INCLUDING THE SAME

CROSS-REFERENCE TO RELATED APPLICATIONS

This application claims priority from and the benefit of Korean Patent Application No. 10-2019-0086582, filed on Jul. 17, 2019, which is hereby incorporated by reference for all purposes as if fully set forth herein.

BACKGROUND

Field

Exemplary embodiments of the invention relate generally to a display device, and more specifically, to a display device having improved reliability.

Discussion of the Background

When manufacturing a display device, a display panel is manufactured, and then a circuit board is connected to the display panel. For example, a tape automated bonding (TAB) mounting method bonds a flexible circuit board to the display panel by using an anisotropic conductive film (ACF).

The above information disclosed in this Background section is only for understanding of the background of the inventive concepts, and, therefore, it may contain information that does not constitute prior art.

SUMMARY

Display devices constructed according to principles and exemplary embodiments of the invention may prevent or suppress a delamination defect of a circuit board generated from bending the circuit board.

Additional features of the inventive concepts will be set forth in the description which follows, and in part will be apparent from the description, or may be learned by practice of the inventive concepts.

According to one or more exemplary embodiments of the invention, a display device includes: a display panel including a plurality of display pads each extending in a first direction and arranged in a second direction crossing the first direction; a main circuit board; and a flexible circuit board including: board pads connected to the display pads; and a floating pattern spaced apart from the board pads, the floating pattern connected to the display panel by an anisotropic conductive film (ACF), wherein at least a portion of the floating pattern does not overlap with the ACF in plan view.

The display panel includes a dummy pattern, the dummy pattern connected to the floating pattern, and the floating pattern may have a length in the first direction, which may be greater than a length of the dummy pattern in the first direction.

The floating pattern may have a length in the first direction equal to or greater than 200 µm and equal to or smaller than 250 µm.

The floating pattern may have a width in the second direction equal to or greater than 25 µm and equal to or smaller than 75 µm.

The floating pattern may be provided in plurality, and a distance between adjacent floating patterns in the second direction may be about 50 µm.

The floating patterns may each extend in the first direction and may be arranged in the second direction.

The floating patterns may each extend in the second direction and may be arranged in the first direction.

The flexible circuit board may include: a first edge extending in the second direction and overlapping the display panel; and a second edge extending in the first direction and connected to the first edge, wherein a spaced distance between the first edge and the floating pattern in the first direction may be about 50 µm.

A spaced distance from the second edge to the floating pattern may be equal to or greater than 90 µm and equal to or smaller than 100 µm.

The floating pattern may include: a first pattern extending in the first direction; a second pattern spaced apart from the first pattern in the first direction and the second direction; and a third pattern connecting the first pattern and the second pattern.

According to one or more exemplary embodiments of the invention, a display device includes: a display panel including: a plurality of display pads each extending in a first direction and arranged in a second direction crossing the first direction; and a dummy pattern spaced apart from the display pads; a main circuit board; and a flexible circuit board including: board pads connected to the display pads; and a floating pattern connected to the dummy pattern, wherein the floating pattern may have a length in the first direction, which may be greater than a length of the dummy pattern in the first direction.

The display panel and the flexible circuit board may be connected by an anisotropic conductive film (ACF), and at least a portion of the floating pattern may not overlap with the ACF in a plan view.

The length of the floating pattern in the first direction may be equal to or greater than 200 µm and equal to or small than 250 µm.

A width of the floating pattern in the second direction may be equal to or greater than 25 µm and equal to or small than 75 µm.

The floating pattern may be provided in plurality, and a distance between adjacent floating patterns in the second direction may be about 50 µm.

The floating patterns may each extend in the first direction and may be arranged in the second direction.

The floating patterns may each extend in the second direction and may be arranged in the first direction.

The flexible circuit board may include: a first edge extending in the second direction, the first edge overlapping the display panel; and a second edge extending in the first direction and connected to the first edge, and wherein a spaced distance between the first edge and the floating pattern in the first direction may be about 50 µm.

A spaced distance from the second edge to the floating pattern may be equal to or greater than 90 µm and equal to or smaller than 100 µm.

The floating pattern may include: a first pattern extending in the first direction; a second pattern spaced apart from the first pattern in the first direction and the second direction; and a third pattern connecting the first pattern and the second pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
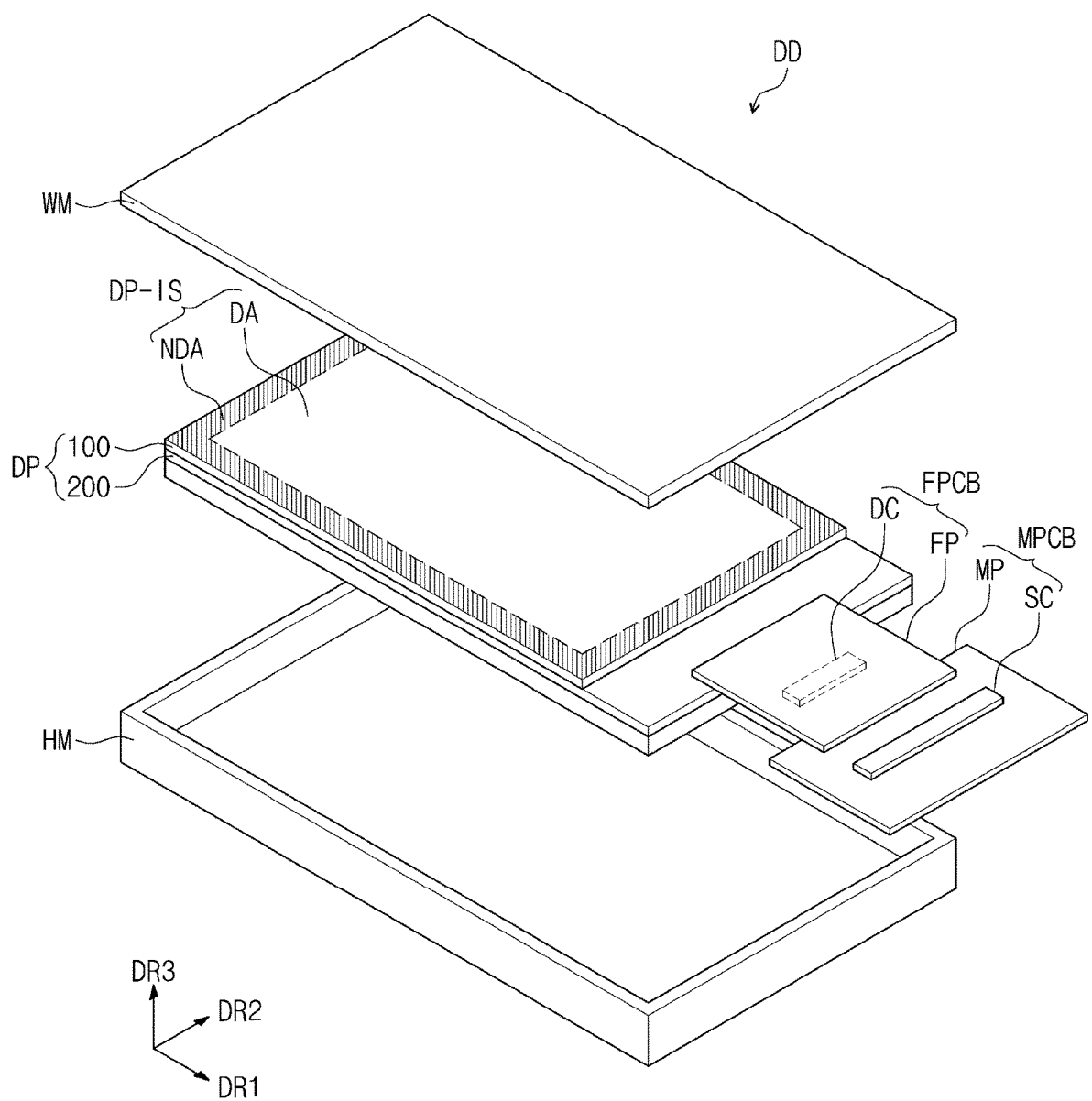
FIG. 1 is an exploded perspective view illustrating a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
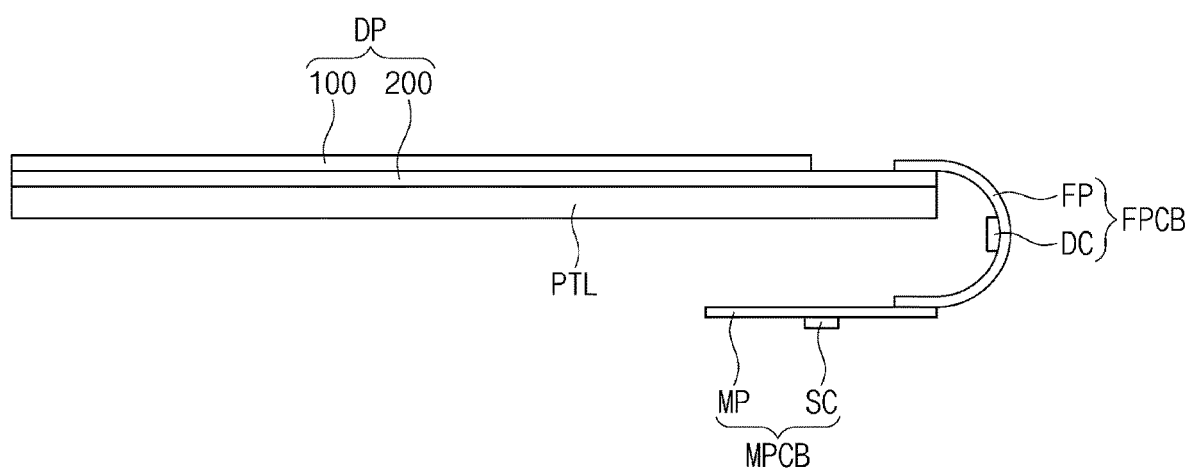
FIG. 2 is a cross-sectional view illustrating the display device according to another exemplary embodiment.
Figure 3:
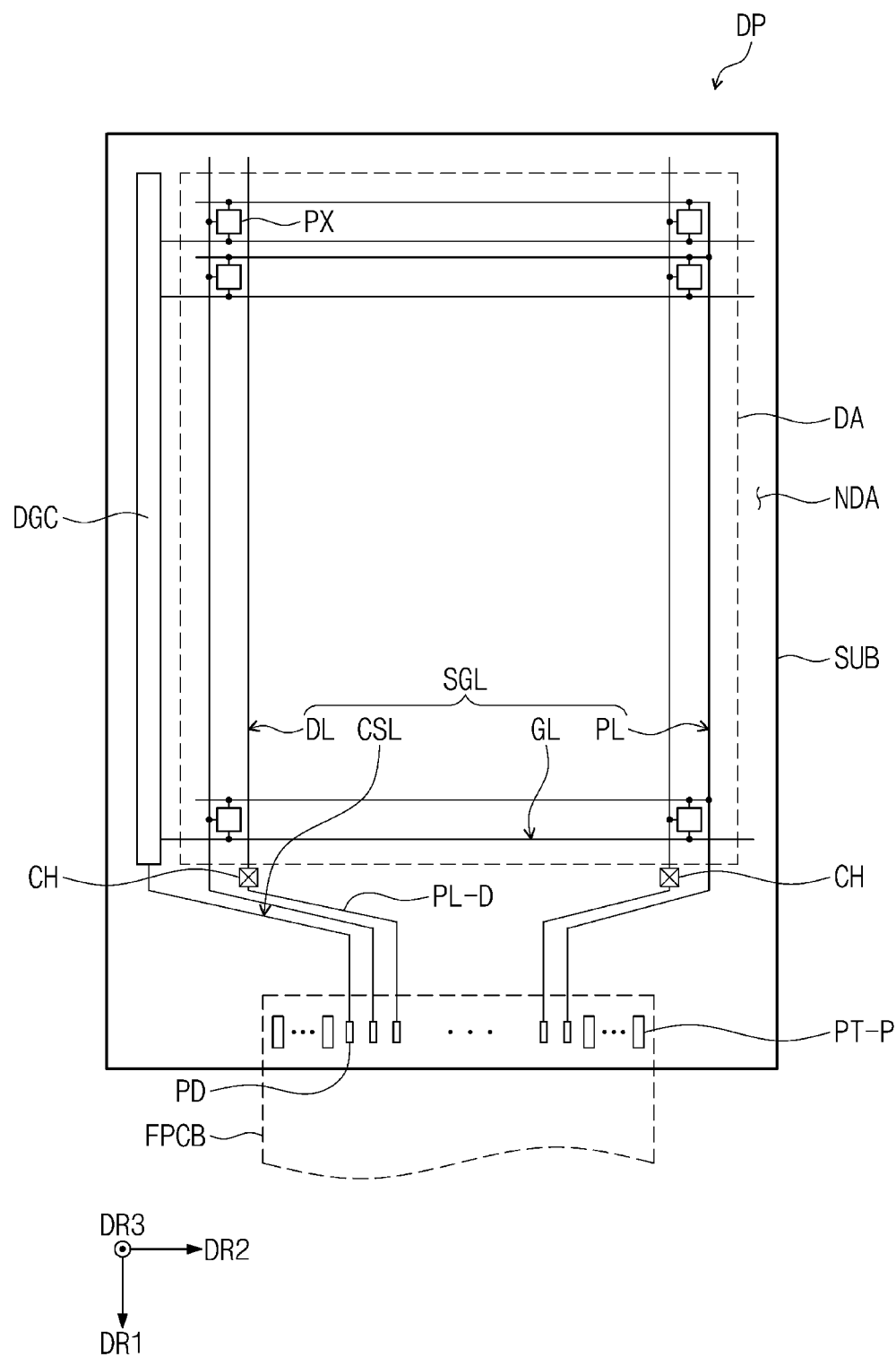
FIG. 3 is a plan view illustrating a display panel according to an exemplary embodiment.
Figure 4A:
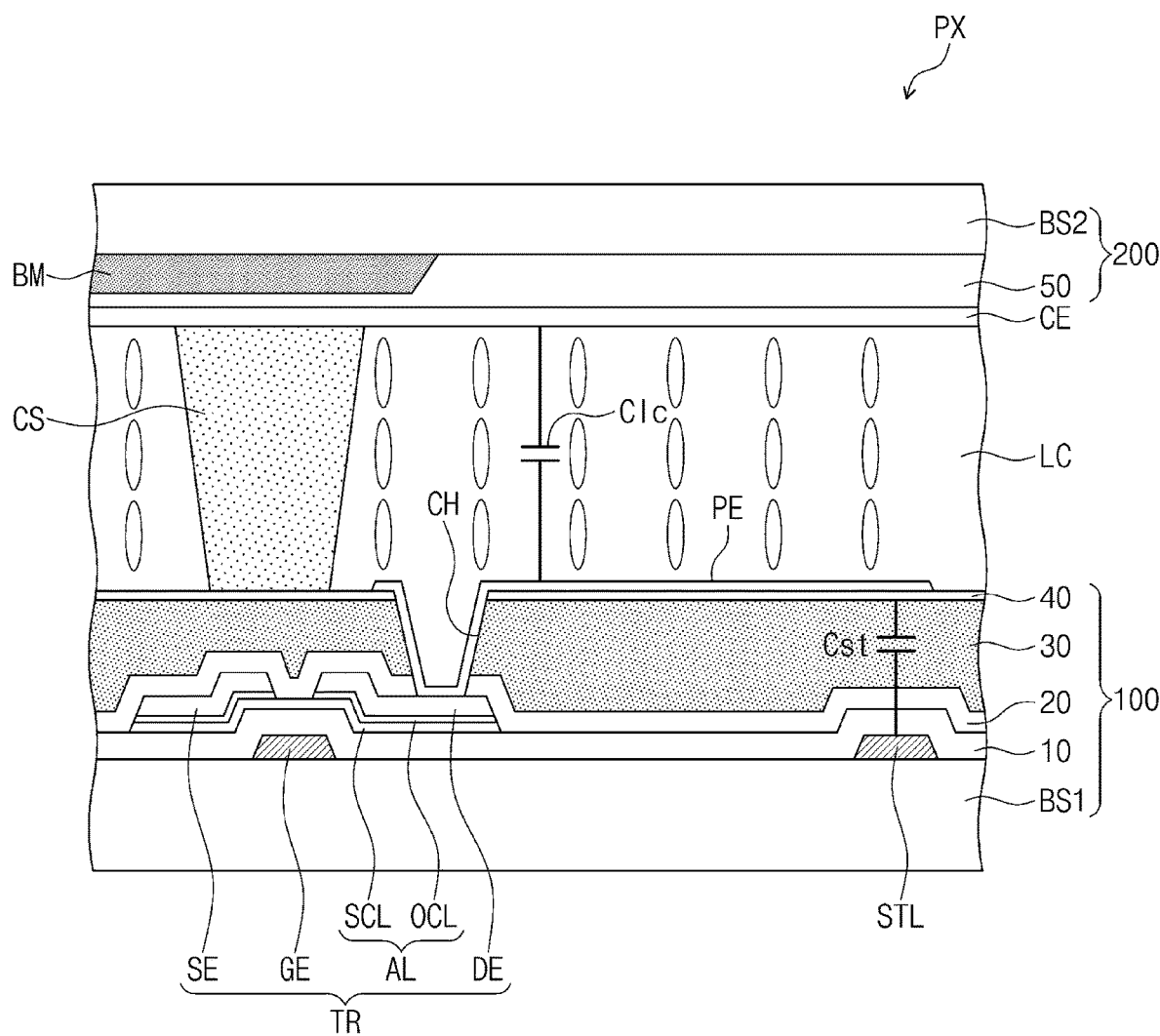
FIG. 4A is a cross-sectional view illustrating a display panel according to an exemplary embodiment.
Figure 4B:
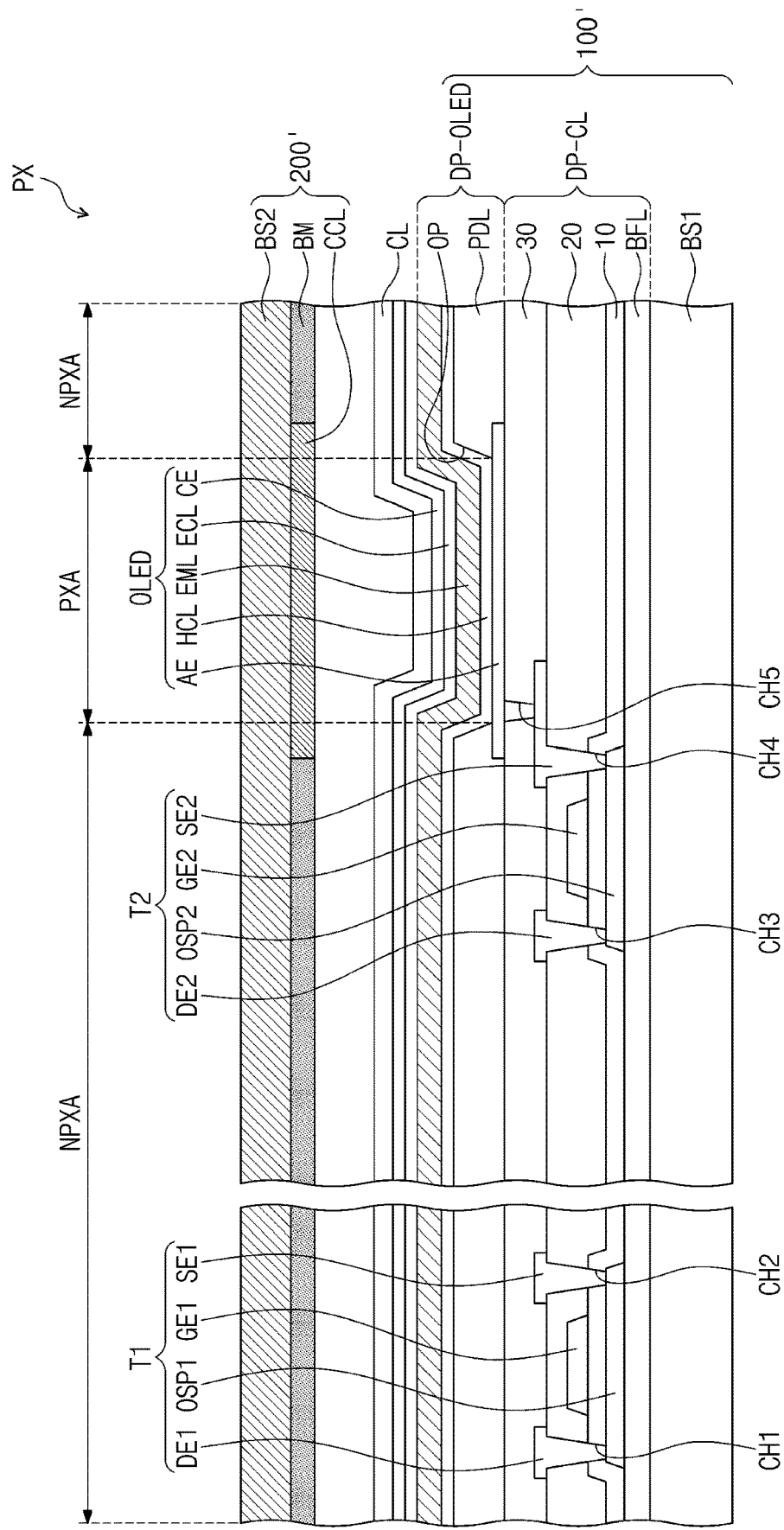
FIG. 4B is a cross-sectional view illustrating a display panel according to an exemplary embodiment.

FIG. 1 is an exploded perspective view illustrating a display device according to an exemplary embodiment. FIG. 2 is a cross-sectional view illustrating the display device according to another exemplary embodiment. FIG. 3 is a plan view illustrating a display panel according to an exemplary embodiment. FIG. 4A is a cross-sectional view illustrating a display panel according to an exemplary embodiment. FIG. 4B is a cross-sectional view illustrating a display panel according to an exemplary embodiment.

The display device DD includes a window member WM, a display panel DP, a flexible circuit board FPCB, a main circuit board MPCB, a protection member PTL, and an accommodation member HM.

The window member WM is disposed on the display panel DP. The window member WM protects the display panel DP by resisting an impact applied from the outside and suppressing permeation of foreign substances. The window member WM may be made of a transparent material capable of outputting an image. For example, the window member WM may be made of glass, sapphire, or plastic. Although the window member WM is illustrated as a single layer, the exemplary embodiment is not limited thereto. For example, the window member WM may include a plurality of layers. Although not shown, the window member WM may further include a bezel area corresponding to a non-display area NDA that will be described later. However, thereof the inventive concept is not limited thereto.

The display panel DP may include a first display substrate 100 and a second display substrate 200. The second display substrate 200 may be disposed on the first display substrate 100. A gradation display layer for generating an image may be disposed between the first display substrate 100 and the second display substrate 200. The gradation display layer may include one of a liquid crystal layer, an organic light emitting layer, and an electrophoretic layer.

The display panel DP may display an image through a display surface DP-IS. The display surface DP-IS is parallel to a plane defined by a first directional axis DR1 and a second directional axis DR2. The display surface DP-IS may include a display area DA and a non-display area NDA. The non-display area NDA is defined along an edge of the display surface DP-IS. The display area DA may be surrounded by the non-display area NDA. In an exemplary embodiment, the non-display area NDA may be disposed on only one side area adjacent to the flexible circuit board FPCB.

A normal direction of the display surface DP-IS, i.e., a thickness direction of the display panel DP, indicates a third directional axis DR3. Hereinafter, a front surface (or top surface) and a rear surface (or bottom surface) of each of members are distinguished by the third directional axis DR3. However, the first to third directional axes DR1, DR2, and DR3 in the exemplary embodiment are only exemplarily illustrated. Hereinafter, first to third directions may be directions indicated by the first to third directional axes DR1, DR2, and DR3 and designated by the same reference numerals, respectively.

Although the display panel DP having a flat display surface DP-IS is illustrated In an exemplary embodiment, the exemplary embodiment is not limited thereto. The display device DD may include a curved display surface or a three-dimensional display surface. The three-dimensional display surface may include a plurality of display areas indicating different directions from each other.

The display panel DP is disposed below the window member WM. The display panel DP generates an image and provides the image to the window member WM.

According to an exemplary embodiment, the display panel DP may include an organic light emitting display panel, a liquid crystal display panel, a plasma display panel, an electrophoretic display panel, a microelectromechanical system (MEMS) display panel, and an electrowetting display panel.

The main circuit board MPCB may include a main board MP and a signal control unit SC. The signal control unit SC may be connected to signal lines SGL disposed in the main board MP. The signal control unit SC receives image data and control signals from an external graphic control unit (not shown). The signal control unit SC may provide a control signal to the display panel DP.

The flexible circuit board FPCB may be connected to each of the display panel DP and the main circuit board MPCB by a conductive adhesive member. The conductive adhesive member may include an anisotropic conductive film (ACF). Hereinafter, the conductive adhesive member will be described as the anisotropic conductive film (ACF).

The flexible circuit board FPCB includes a flexible board FP, a driving chip DC, and board pads F-PD and M-PD (refer to FIG. 5A) that will be described later. The flexible board FP may have flexibility. Thus, the flexible board FP may have various shapes in correspondence to an object and a shape of the display panel DP.

Figure 5A:
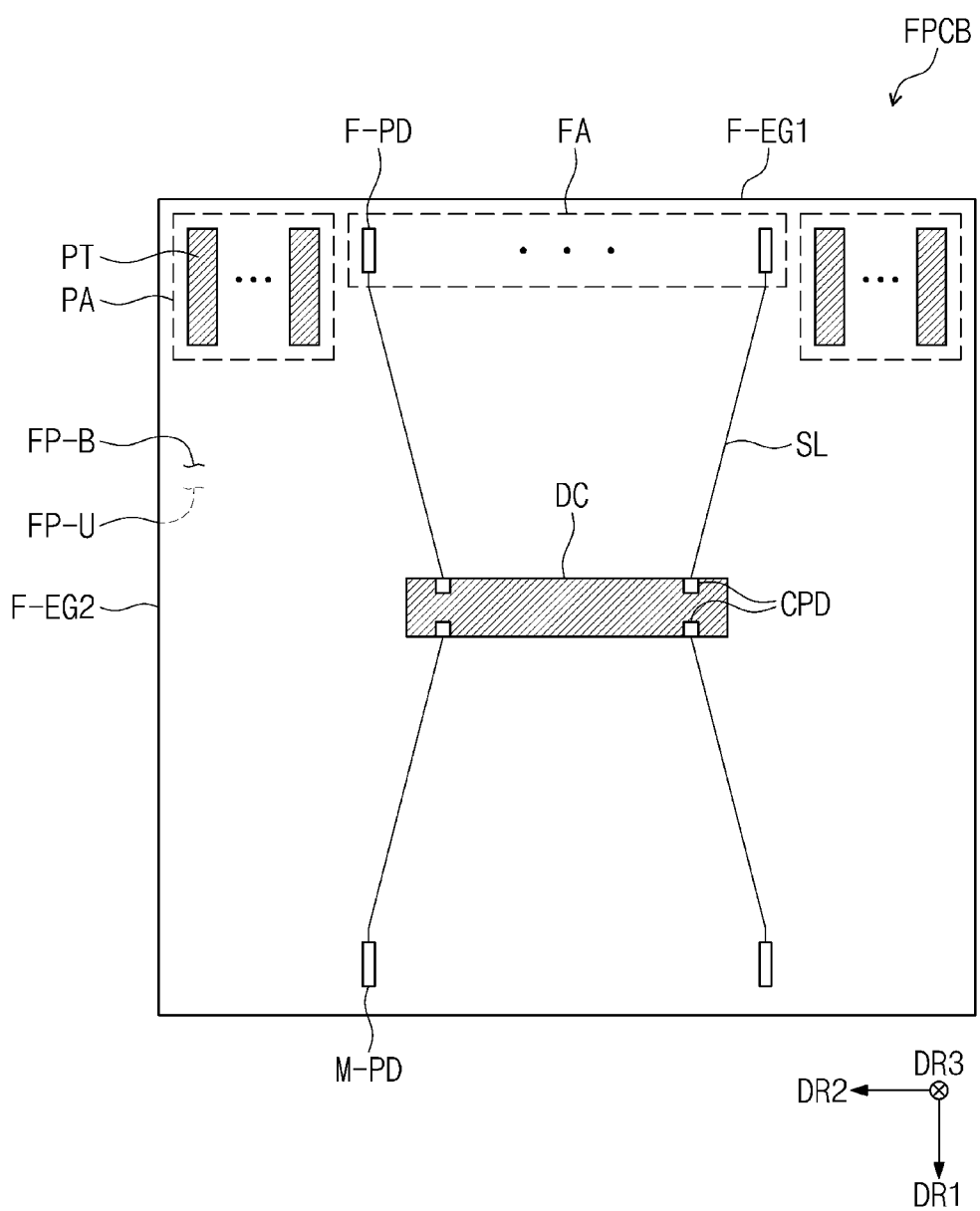
FIG. 5A is a rear view illustrating a flexible circuit board according to an exemplary embodiment.

Although one flexible circuit board FPCB is illustrated for convenience of description in FIG. 5A, the exemplary embodiment is not limited thereto. For example, the display device may include a plurality of flexible circuit boards arranged in the second direction DR2 or a pair of flexible circuit boards in which at least portions overlap each other.

The driving chip DC may be mounted on the flexible board FP in a type of chip on film (COF). The driving chip DC may include driving elements for driving pixels PX, e.g., a data driving circuit.

The protection member PTL is disposed below the display panel DP. The protection member PTL may include functional layers that are necessary for assisting driving of the display panel DP. For example, the protection member PTL may include at least one of a supporting layer, an impact absorbing layer, a heat dissipation layer, and a light blocking layer.

The supporting layer supports the display panel DP. The supporting layer may contain a thermoplastic resin. For example, the supporting layer may have excellent fatigue strength, electrical characteristics, and heat-resistance and be less influenced by temperature and moisture by using polyethyeleneterepthalate (PET).

The impact absorbing layer may be a synthetic resin expandable foam. The impact absorbing layer may be provided as a matrix layer including a plurality of pores. As the plurality of pores have a porous structure, the pores may easily absorb an external impact applied to the display device DD.

The light blocking layer may serve to improve a limitation in which components disposed on a rear surface of the display panel DP are seen through the window member WM. The light blocking layer may block light emitted from the display panel DP to the rear surface thereof.

The accommodation member HM accommodates the display panel DP. The accommodation member HM may be coupled with the window member WM to define an outer appearance of the display device DD. The accommodation member HM protects the components accommodated in the accommodation member HM by absorbing an impact applied from the outside and preventing or suppressing foreign substances and moisture from being permeated to the display device DD. Although not shown, the accommodation member HM may have a shape in which a plurality of accommodation members is coupled.

As illustrated in FIG. 2, the flexible circuit board FPCB may be bent in a direction toward the rear surface of the protection member PTL. According to exemplary embodiments, the flexible circuit board FPCB may be bent at a predetermined curvature. The main circuit board MPCB may be connected with the flexible circuit boards FPCB and accommodated in the accommodation member HM in a state in which the flexible circuit board FPCB is bent.

When the flexible circuit board FPCB is bent, the flexible circuit boards FPCB receives a tensile or compressive stress. An edge of the flexible circuit board FPCB, on which the board pads F-PD (refer to FIG. 5A) are not disposed, may be delaminated from the display panel because the edge is not evenly distributed by the board pads F-PD when the isotropic conductive film ACF is compressed.

Referring to FIG. 3, a planar arrangement relationship in the display panel DP according to an exemplary embodiment is shown. The signal lines SGL includes gate lines GL, data lines DL, a power line PL, and a control signal line CSL. Each of the gate lines GL is connected to the corresponding pixel PX of the pixels PX, and each of the data lines DL is connected to the corresponding pixel PX of the pixels PX. The power line PL is connected to the pixels PX. The control signal line CSL may provide control signals to the gate driving circuit. Signal lines SGL overlap the display area DA and the non-display area NDA.

The plurality of gate lines GL each extend in the second direction DR2 and are arranged in the first direction DR1. The plurality of data lines DL cross the gate lines GL in an insulating manner. The data lines DL each extend in the first direction DR1 and are arranged in the second direction DR2.

Auxiliary signal lines PL-D overlap the non-display area NDA and are connected to the data lines DL. The auxiliary signal lines PL-D connected to the data lines DL are disposed on a different layer from the data lines DL. The data lines DL may be electrically connected to the corresponding auxiliary signal line of the auxiliary signal lines PL-D through a contact hole CH. The contact hole CH passes through at least one insulation layer disposed between the data lines DL and the auxiliary signal lines PL-D. In FIG. 3, two contact holes CH are exemplarily illustrated.

In an exemplary embodiment, the contact hole CH may be omitted. In such case, the data lines DL and the auxiliary signal lines PL-D may be disposed on the same layer. Furthermore, the data line and the auxiliary signal line, which are connected to each other, among the data lines DL and the auxiliary signal lines PL-D may be defined as one signal line. In other words, each of the data line and the auxiliary signal line, which are connected to each other, may be defined as a different portion of the signal line SGL.

Each of the pixels PX is connected to the corresponding gate line of the plurality of gate lines GL and the corresponding data line of the plurality of data lines DL. Each of the pixels PX may include a pixel driving circuit and a display element.

Although the pixels PX arranged in a matrix form is exemplarily illustrated in FIG. 3, the exemplary embodiment is not limited thereto. Alternatively, the pixels PX may be arranged in a PenTile form.

A gate driving circuit GDC may be integrated to the display panel DP through an oxide silicon gate driver circuit (OSG) or amorphous silicon gate driver circuit (ASG) process. First auxiliary signal lines PL-G receive a gate signal from the gate driving circuit GDC.

The display panel DP according to an exemplary embodiment includes display pads PD and a dummy pattern PT-P. The display pads PD are disposed in the non-display area NDA. The display pads PD may be arranged in the second direction DR2.

The display pads PD are connected to the corresponding pixels PX, respectively. Some of the display pads PD may be connected to the corresponding pixels PX, and the rest of the display pads PD may be connected to the driving circuit GDC. The display pads PD are connected to the board pads F-PD (refer to FIG. 5A) of the flexible circuit board FPCB.

The dummy pattern PT-P may be spaced apart from the display pads PD. The dummy pattern PT-P may be separated from the signal lines SGL of the pixels PX and be in a floating state. Thus, the dummy pattern PT-P may not be affected by a signal transmitted from the main circuit board MPCB.

The dummy pattern PT-P may be provided in plurality, and the plurality of dummy patterns PT-P may be spaced apart from each other with the display pads PD therebetween. The dummy pattern PT-P may be provided through the same process as the display pads PD. Thus, the dummy pattern PT-P may be disposed on the same layer as the display pads PD and contain the same material as the display pads PD.

The dummy pattern PT-P according to an exemplary embodiment may overlap at least a portion of a floating pattern PT of the flexible circuit board FPCB. Detailed description thereof will be described later. In FIG. 3, the flexible circuit board FPCB disposed on the display pads PD and the dummy pattern PT-P is expressed by a dotted line.

Referring to FIG. 4A, the gradation display layer of the display panel DP according to an exemplary embodiment may be a liquid crystal layer LC. Thus, the display panel DP may be a liquid crystal display panel. The pixel PX of the liquid crystal display panel may include a transistor TR, a liquid crystal capacitor Clc, and a storage capacitor Cst.

The transistor TR includes a control electrode GE connected to the gate line, an activation part AL overlapping the control electrode GE, an input electrode SE connected to the data line, and an output electrode DE spaced apart from the input electrode SE. The liquid crystal capacitor Clc includes a pixel electrode PE and a common electrode CE. The storage capacitor Cst includes the pixel electrode PE and a portion of a storage line STL overlapping the pixel electrode PE.

The control electrode GE and the storage line STL are disposed on one surface of the first base substrate BS1. The first base substrate BS1 may be one of a glass substrate, a plastic substrate, and a substrate containing polyimide (PI). A first insulation layer 10, which covers the control electrode GE and the storage line STL, is disposed on the one surface of the first base substrate BS1. The first insulation layer 10 may contain at least one of an inorganic material and an organic material.

The activation part AL, which overlaps the control electrode GE, is disposed on the first insulation layer 10. The activation part AL may include a semiconductor layer SCL and an ohmic contact layer OCL. The semiconductor layer SCL is disposed on the first insulation layer 10, and the ohmic contact layer OCL is disposed on the semiconductor layer SCL.

The semiconductor layer SCL may contain an amorphous silicon or crystalline silicon. Also, the semiconductor layer SCL may include a metal oxide semiconductor. The ohmic contact layer OCL may include a dopant that is doped with a higher density than the semiconductor layer. The ohmic contact layer OCL may include two portions spaced apart from each other. In an exemplary embodiment, the ohmic contact layer OCL may have an integrated shape.

The output electrode DE and the input electrode SE are disposed on the activation part AL. The output electrode DE and the input electrode SE are spaced apart from each other. A second insulation layer 20 covering the activation part AL, the output electrode DE, and the input electrode SE is disposed on the first insulation layer 10. A third insulation layer 30 is disposed on the second insulation layer 20. Each of the second insulation layer 20 and the third insulation layer 30 may contain at least one of an inorganic material and an organic material. The third insulation layer 30 is disposed on the second insulation layer 20. The third insulation layer 30 may be a single layered organic layer that provides a flat surface. In the exemplary embodiment, the third insulation layer 30 may include a plurality of color filters. A fourth insulation layer 40 is disposed on the third insulation layer 30. The fourth insulation layer 40 may be an inorganic layer covering the color filters.

As illustrated in FIG. 3A, the pixel electrode PE is disposed on the fourth insulation layer 40. The pixel electrode PE is connected to the output electrode DE through a contact hole CH passing through the second insulation layer 20, the third insulation layer 30, and the fourth insulation layer 40. An alignment layer (not shown) covering the pixel electrode PE may be disposed on the fourth insulation layer 40.

The second base substrate BS2 may be one of a glass substrate, a plastic substrate, and a substrate containing polyimide (PI). A black matrix layer BM is disposed on a bottom surface of the second base substrate BS2. That is, openings corresponding to pixel areas may be defined in the black matrix layer BM. A spacer CS may be disposed to overlap the black matrix layer BM.

Insulation layers covering the black matrix layer BM is disposed on the bottom surface of the second base substrate BS2. A fifth insulation layer 50 providing a flat surface is exemplarily illustrated in FIG. 4A. The fifth insulation layer 50 may contain an organic material.

The common electrode CE is disposed on the bottom surface of the second base substrate BS2. The alignment layer (not shown) may be disposed on the common electrode CE.

The common electrode CE according to an exemplary embodiment may include transmissive metal such as transparent conductive oxide (TCO).

A common voltage is applied to the common electrode CE. The common voltage may have a different value from or the same value as the pixel voltage. When the common voltage and the pixel voltage in the liquid crystal display panel in a vertical alignment (VA) mode have the same value as each other, a potential difference may be about 0, and, a screen having a black color may be displayed in the display area DA (refer to FIG. 1).

The cross-section of the pixel PX in FIG. 4A is intended to be illustrative. The first display substrate 100 and the second display substrate 200 may be turned over in the third direction DR3. The color filters may be disposed on the second display substrate 200.

Although the liquid crystal display panel in the vertical alignment (VA) mode is exemplarily described with reference to FIG. 4A, the exemplary embodiment is not limited to the liquid crystal display panel having a specific mode. For example, In an exemplary embodiment, one of an in-plane switching (IPS) mode, a fringe-field switching (FFS) mode, a plane to line switching (PLS) mode, and a vertical alignment (VA) mode.

Referring to FIG. 4B, the gradation display layer of the display panel DP according to an exemplary embodiment may include an organic light emitting layer EML. Thus, the display panel DP may be an organic light emitting display panel. The pixel PX of the organic light emitting display panel may include a switching transistor T1, a driving transistor T2, and a light emitting element OLED.

The organic light emitting display panel includes a display substrate 100' and an encapsulation substrate 200'. The display substrate 100' includes a first base substrate BS1, a circuit element layer DP-CL disposed on the first base substrate BS1, a display element layer DP-OLED disposed on the circuit element layer DP-CL, and a cover layer CL disposed on the display element layer DP-OLED. The encapsulation substrate 200' may include a second base substrate BS2, a black matrix layer BM disposed on the second base substrate BS2, and a color conversion layer CCL.

The first base substrate BS1 may be one of a glass substrate, a plastic substrate, and a substrate containing polyimide (PI). The circuit element layer DP-CL includes at least one insulation layer and a circuit element. The circuit element includes a signal line and a driving circuit of a pixel. The circuit element layer DP-CL may be provided through a process of forming an insulation layer, a semiconductor layer, and a conductive layer by coating, deposition, or the like and a process of patterning the insulation layer, the semiconductor layer, and the conductive layer by a photolithography process.

In the exemplary embodiment, the circuit element layer DP-CL may include a buffer layer BFL, a first insulation layer 10, a second insulation layer 20, and a third insulation layer 30. Each of the first insulation layer 10 and the second insulation layer 20 may be an inorganic layer, and the third insulation layer 30 may be an organic layer.

FIG. 4 exemplarily illustrates an arrangement relationship between a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2, which constitute the switching transistor T1 and the driving transistor T2. First, second, third, and fourth through-holes CH1, CH2, CH3, and CH4 are also exemplarily illustrated.

The display element layer DP-OLED includes the light emitting element OLED. The display element layer DP-OLED may include an organic light emitting diode as the light emitting element OLED. The display element layer DP-OLED includes a pixel defining layer PDL. For example, the pixel defining layer PDL may be an organic layer.

A first electrode AE is disposed on the intermediate organic layer 30. The first electrode AE is connected to the second output electrode SE2 through a fifth contact hole CH5 passing through the intermediate organic layer 30. An opening OP is defined in the pixel defining layer PDL. The opening OP of the pixel defining layer PDL exposes at least a portion of the first electrode AE. The opening OP of the pixel defining layer PDL is referred to as a light emitting opening to be distinguished from other openings.

As illustrated in FIG. 4B, the display panel DP may include a light emitting area PXA and a non-light emitting area NPXA disposed adjacent to the light emitting area PXA. The non-light emitting area NPXA may surround the light emitting area PXA. In the exemplary embodiment, the light emitting area PXA is defined in correspondence to a partial area of the first electrode AE, which is exposed by the light emitting opening OP.

A hole control layer HCL may be commonly disposed in the light emitting area PXA and the non-light emitting area NPXA. The hole control layer HCL may include a hole transporting layer and may further include a hole injection layer. An organic light emitting layer EML is disposed on the hole control layer HCL. The organic light emitting layer EML may be commonly disposed in the light emitting area PXA and the non-light emitting area NPXA. However, the exemplary embodiment is not limited thereto. For example, the organic light emitting layer EML may be disposed in the light emitting area PXA and may not be disposed in the non-light emitting area NPXA. The organic light emitting layer EML may include an organic material and/or an inorganic material. The organic light emitting layer EML may generate light having a predetermined color, e.g., blue light.

An electron control layer ECL is disposed on the organic light emitting layer EML. The electron control layer ECL may include an electron transporting layer and may further include an electron injection layer. The hole control layer HCL and the electron control layer ECL may be commonly provided to the plurality of pixels by using an open mask. A second electrode CE is disposed on the electron control layer ECL. The second electrode CE is commonly disposed on the plurality of pixels. A cover layer CL, which protects the second electrode CE, may be disposed on the second electrode CE. The cover layer CL may contain an organic material or an inorganic material.

The second base substrate BS2 is spaced apart from the cover layer CL. The second base substrate BS2 may be one of a glass substrate, a plastic substrate, and a substrate containing polyimide (PI). The color conversion layer CCL may transmit first color light or covert the first color light into second color light or third color light according to the pixel PX.

The color conversion layer CCL may include a quantum dot. In an exemplary embodiment, the encapsulation substrate 200' may be replaced by a thin-film encapsulation layer including a plurality of inorganic layers and an organic layer sealed by the inorganic layers. According to exemplary embodiments, the black matrix layer BM and the color conversion layer CCL may be disposed on the thin-film encapsulation layer.

Figure 5B:
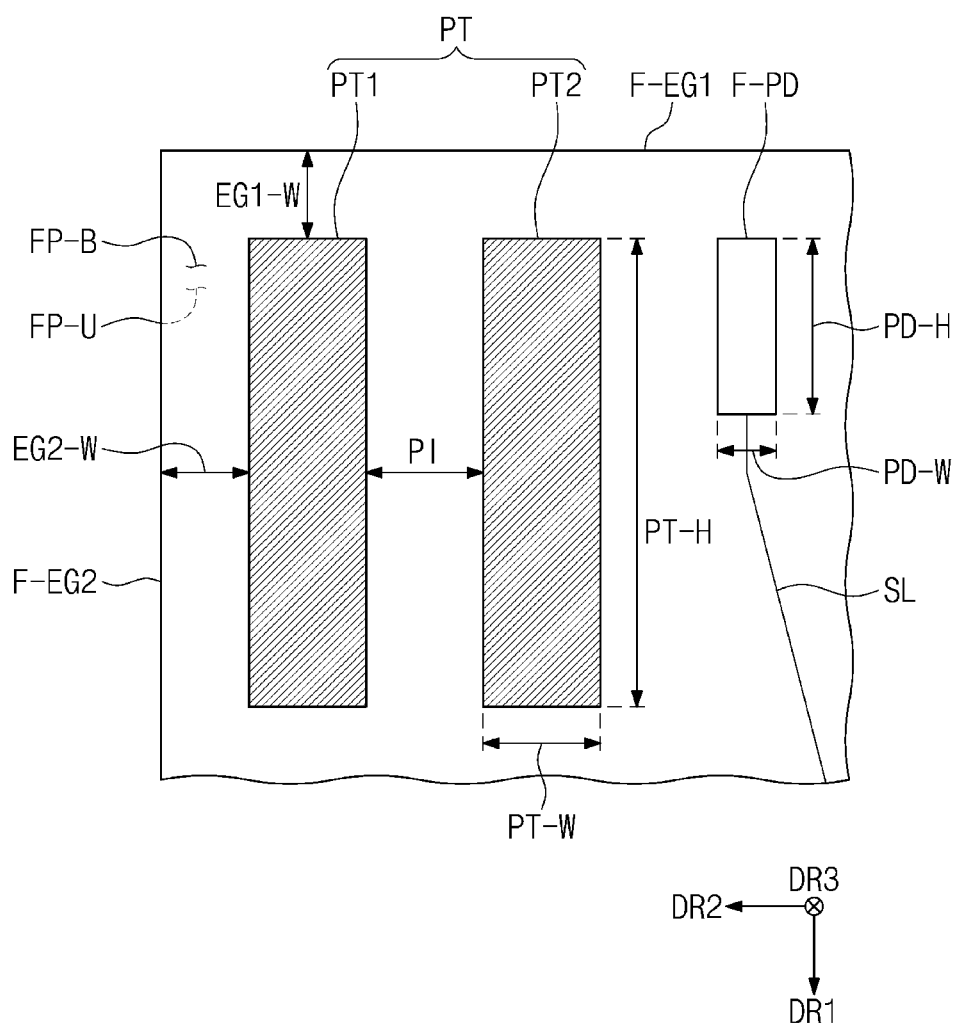
FIG. 5B is an enlarged view illustrating one area of the flexible circuit board in FIG. 5A.

FIG. 5A is a rear view illustrating a flexible circuit board according to an exemplary embodiment. FIG. 5B is an enlarged view illustrating one area of the flexible circuit board in FIG. 5A. The same or similar components as those in FIGS. 1 to 4B will be designated by the same or similar reference numerals, and overlapped description will be omitted.

The flexible board FP of the flexible circuit board FPCB according to an exemplary embodiment includes a top surface FP-U and a bottom surface FP-B disposed opposite to the top surface FP-U. The flexible circuit board FPCB includes board signal lines SL, a driving chip DC disposed on a bottom surface FP-B, a plurality of board pads F-PD and M-PD exposed from the bottom surface FP-B, connection pads CPD, and a floating pattern PT. For convenience of description, a board pad area FA on which the board pads F-PD and M-PD are disposed and a floating pattern area PA on which the floating pattern PT is disposed are expressed by a dotted line.

The connection pads CPD are connected to connection terminals of the driving chip DC. The board pads F-PD and M-PD may include first pads F-PD connected to the display panel DP and second pads M-PD connected to the main circuit board MPCB.

The board signal lines SL connect the connection pads CPD to the first pads F-PD and the connection pads CPD to the second pads M-PD. When the driving chip DC is omitted, the board signal lines SL may connect the first pads F-PD and the second pads M-PD.

The floating pattern PT may be disposed on the same surface as the first pads F-PD. Thus, the floating pattern PT may be disposed on the bottom surface FP-B of the flexible board FP. The floating pattern PT may be spaced apart from the first pads F-PD. The floating pattern PT may be separated from the board signal lines SL and be in a floating state. Thus, the floating pattern PT may not be affected by a signal transmitted from the main circuit board MPCB.

At least a portion of the floating pattern PT may overlap the dummy pattern PT-P of the display panel DP. The pattern PT-P may be connected to the dummy pattern PT-P by the anisotropic conductive film ACF. In the exemplary embodiment, the floating pattern PT may be provided in plurality. The floating patterns may each extend in the first direction DR1 and be spaced apart from each other in the second direction DR2.

The floating pattern areas PA, on which the floating pattern PT is disposed, may be spaced apart from each other with the board pad area FA, on which the board pads F-PD and M-PD are disposed, therebetween.

Referring to FIG. 5B, in the flexible circuit board FPCB of the exemplary embodiment, an end extending in the second direction DR2 may be defined as a first edge F-EG1, and an end extending in the first direction DR1 may be defined as a second edge F-EG2. The first edge F-EG1 may overlap the non-display area NDA (refer to FIG. 1) of the display panel DP, and the second edge F-EG2 may cross the non-display area NDA of the display panel DP.

The floating pattern PT includes a first pattern PT1 and a second pattern PT2. The first pattern PT1 and the second pattern PT2 may each extend in the first direction DR1, and be spaced apart from each other in the second direction DR2.

In the exemplary embodiment, the floating pattern PT includes the first pattern PT1 and the second pattern PT2. The floating pattern PT may have a length PT-H in the first direction DR1, which is in a range from about 200 μm to about 250 μm. Also, the floating pattern PT may have a width PT-W in the second direction DR2, which is in a range from about 25 μm to about 75 μm.

In the exemplary embodiment, a spaced distance PI between the first pattern PT1 and the second pattern PT2 may be about 50 μm. Also, a minimum distance EG1-W from the first edge F-EG1 to the floating pattern PT may be about 50 μm. A minimum distance EG2-W from the second edge F-EG2 to the floating pattern PT may be in a range from about 90 μm to about 100 μm.

In the exemplary embodiment, each of the board pads F-PD may have a length PD-H in the first direction DR1 less than a length PT-H in the first direction DR1 of the floating pattern PT. Also, each of the board pads F-PD may have a width PD-W in the second direction DR2 less than a width PT-W in the second direction DR2 of the floating pattern PT.

Figure 6:
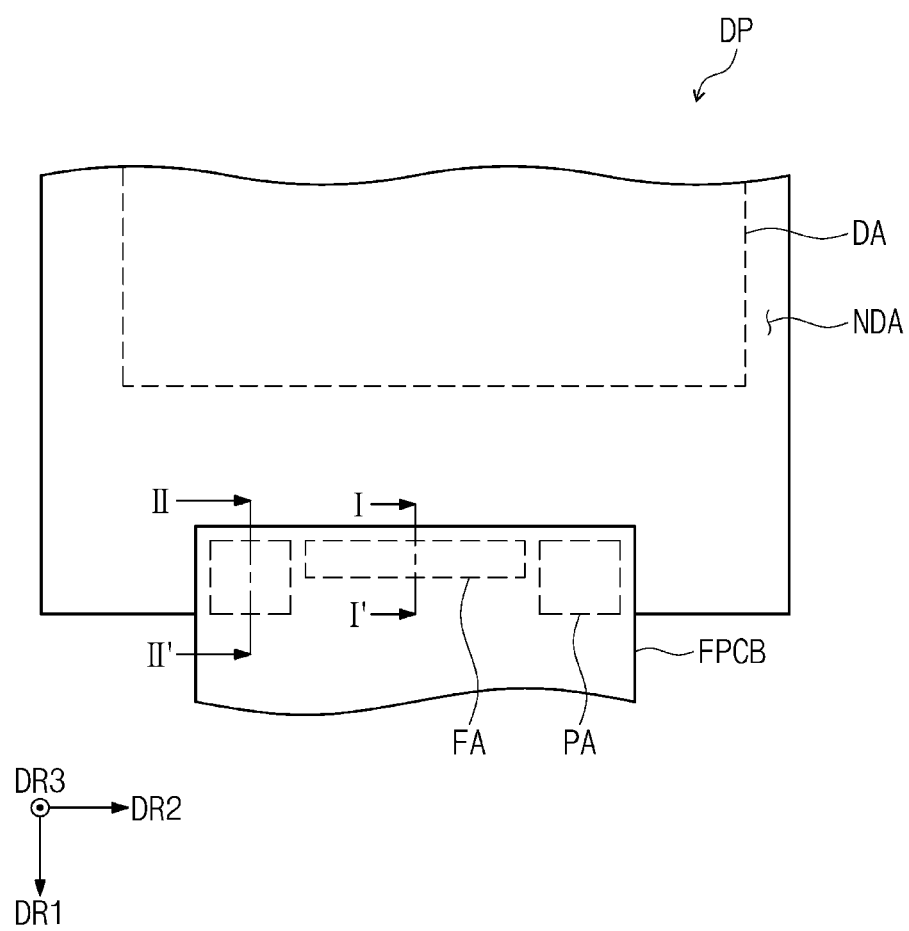
FIG. 6 is a plan view illustrating components of a display device according to an exemplary embodiment.
Figure 7A:
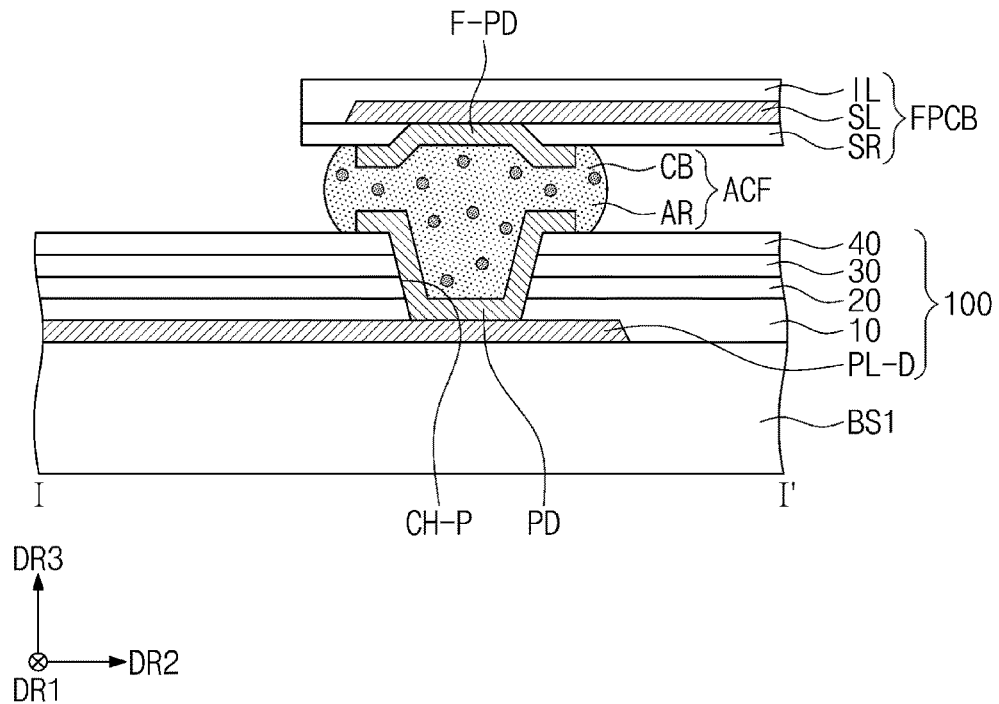
FIG. 7A is a cross-sectional view taken along a sectional line I-I' of FIG. 6.
Figure 7B:
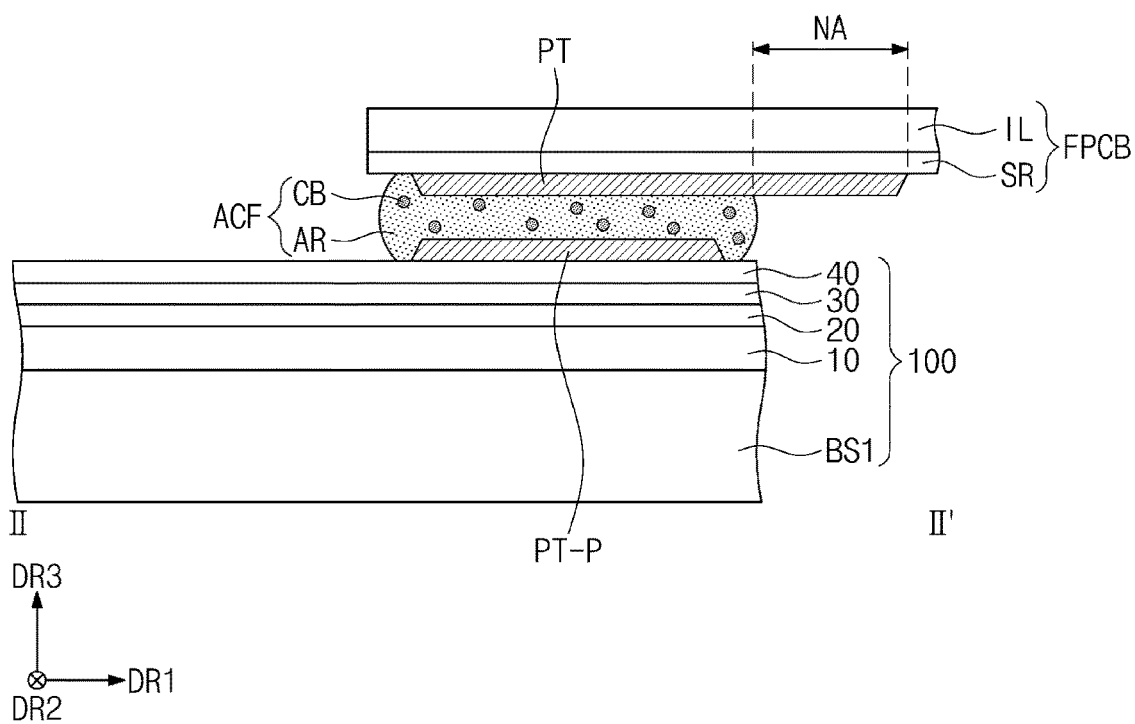
FIG. 7B is a cross-sectional view taken along a sectional line of FIG. 6.
Figure 7C:
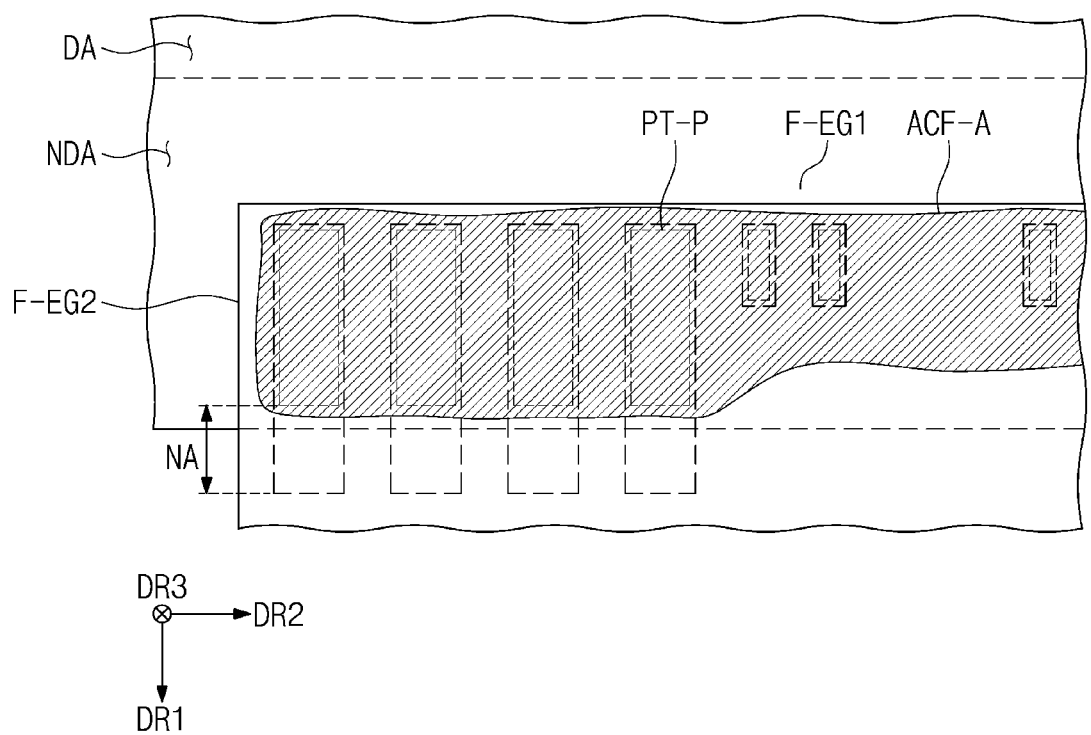
FIG. 7C is an enlarged view illustrating one area of FIG. 6.

FIG. 6 is a plan view illustrating components of a display device according to an exemplary embodiment. FIG. 7A is a cross-sectional view taken along a sectional line I-I' of FIG. 6. FIG. 7B is a cross-sectional view taken along a sectional line of FIG. 6. FIG. 7C is an enlarged view illustrating one area of FIG. 6. The same components as those in FIGS. 1 to 4B will be designated by the same or similar reference numerals, and overlapped description will be omitted. A first display substrate 100 in FIGS. 7A and 7B may correspond to the first display substrate 100 in FIG. 4A.

Referring to FIGS. 6 and 7A, a display pad PD is connected to an auxiliary signal line PL-D through a contact hole CH-P passing through first to fourth insulation layers 10 to 40. The display pad PD is exposed from the first to fourth insulation layers 10 to 40. When the display pad PD is omitted, an end of the auxiliary signal line PL-D may be exposed from the first to fourth insulation layers 10 to 40.

A flexible circuit board FPCB including an insulation layer IL, a board signal line SL, a solder resist layer SR, and a first pad F-PD is exemplarily illustrated.

In the solder resist layer SR, an opening exposing at least a portion of the board signal line SL may be defined. The first pad F-PD may be connected to the board signal line SL exposed by the opening of the solder resist layer SR. The first pad F-PD is electrically connected to the display pad PD through an anisotropic conductive film ACF.

The anisotropic conductive film ACF according to the exemplary embodiment may include an adhesive resin AR and a plurality of conductive balls CB distributed in the adhesive resin AR. The adhesive resin AR may include, e.g., a resin.

The anisotropic conductive film ACF may be disposed between the first pad F-PD and the display pad PD to connect the first pad F-PD and the display pad PD through a thermal compression process.

Referring to FIGS. 6 and 7B, a dummy pattern PT-P according to the exemplary embodiment may be disposed on the fourth insulation layer 40. However, the exemplary embodiment is not limited thereto. For example, the dummy pattern PT-P may be disposed on the first base substrate BS1 and exposed through the contact hole passing through the first to fourth insulation layers 10 to 40. The dummy pattern PT-P is electrically separated from the auxiliary signal line PL-D.

The floating pattern PT may be disposed on the solder resist layer SR. However, the exemplary embodiment is not limited thereto. For example, the floating pattern PT may be disposed on the insulation layer IL and exposed through the opening passing through the solder resist layer SR. The floating pattern PT is electrically separated from the board signal line SL.

The anisotropic conductive film ACF may be disposed between the dummy pattern PT-P and the floating pattern PT to connect the dummy pattern PT-P and the floating pattern PT through a thermal compression process.

In the exemplary embodiment, the floating pattern PT may have a length PT-H1 in the first direction DR1 greater than a length PT-H2 in the first direction DR1 of the dummy pattern PT-P. Thus, one portion of the floating pattern PT may be exposed from the anisotropic conductive film ACF even after the thermal compression process. In other words, according to the exemplary embodiment, at least a portion of the floating pattern PT does not overlap with the anisotropic conductive film ACF in a plan view. In FIG. 7B, an exposed area NA of the floating pattern PT, which protrudes from the anisotropic conductive film ACF, is illustrated. FIG. 7B illustrates that the exposed area NA of the floating pattern PT protrudes from the anisotropic conductive film ACF and therefore, does not overlap with the anisotropic conductive film ACF in the plan view.

Referring to FIG. 7C, the flexible circuit board FPCB and the display panel DP are thermally compressed through the anisotropic conductive film ACF, and then the adhesive resin AR of the anisotropic conductive film ACF shades the adhesive area ACF-A.

According to an exemplary embodiment, when the flexible circuit board FPCB is bent, as one area of the flexible circuit board FPCB, on which the board pads F-PD are not disposed, includes the electrically insulated floating pattern PT, even when the flexible circuit board FPCB and the display panel DP are thermally compressed through the anisotropic conductive film ACF, the adhesive resin AR may be compressed between the floating pattern PT and the dummy pattern PT-P and evenly distributed to an area adjacent to the edges F-EG1 and F-EG2 of the flexible circuit board FPCB. Thus, even when the flexible circuit board FPCB is bent, the flexible circuit board FPCB may be prevented or suppressing from being delaminated, and the display device having improved reliability may be provided.

Figure 8:
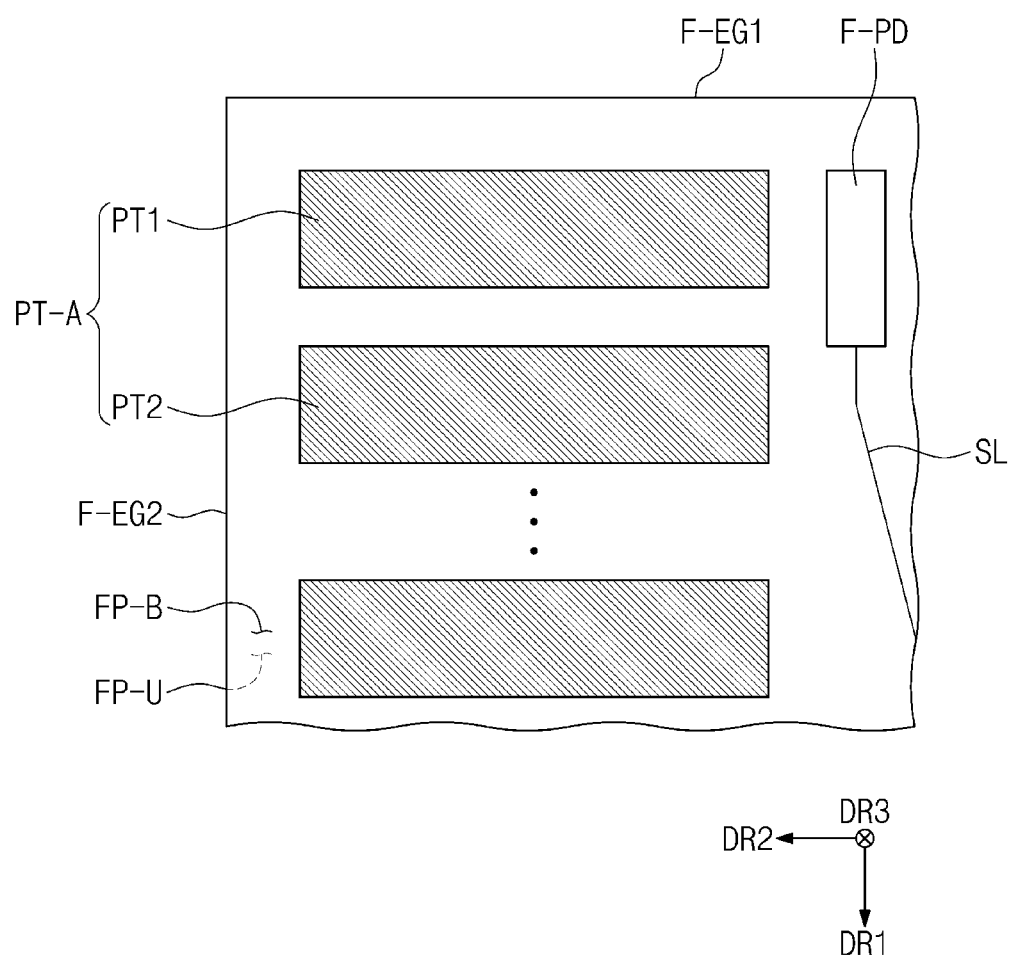
FIG. 8 is a plan view illustrating a flexible circuit board according to an exemplary embodiment.
Figure 9:
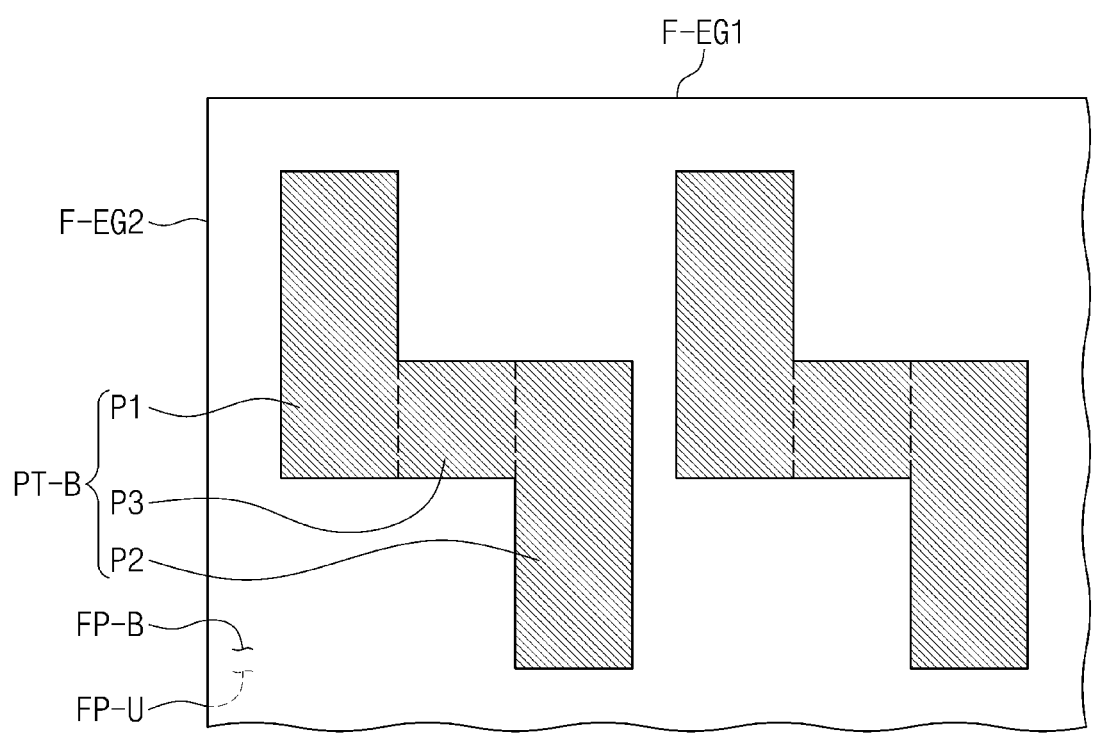
FIG. 9 is a plan view illustrating a flexible circuit board according to an exemplary embodiment.
Figure 9:
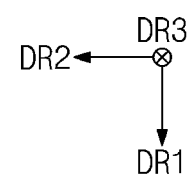

FIG. 8 is a plan view illustrating a flexible circuit board according to an exemplary embodiment. FIG. 9 is a plan view illustrating a flexible circuit board according to an exemplary embodiment. The same or similar components as those in FIGS. 1 to 7B will be designated by the same or similar reference numerals, and overlapped description will be omitted.

Referring to FIG. 8, floating patterns PT-A according to the exemplary embodiment may each extend in the second direction DR2 and be spaced apart from each other in the first direction DR1 unlike the floating patterns PT in FIG. 5A. Thus, the floating patterns PT-A may have an extension direction crossing that of the board pads F-PD and an arrangement direction crossing that of the board pads F-PD.

Referring to FIG. 9, a floating pattern PT-B according to the exemplary embodiment includes a first pattern P1, a second pattern P2, and a third pattern P3. The first pattern P1 may extend in the first direction DR1. The second pattern P2 may be spaced apart from the first pattern P1 in the first direction DR1 and the second direction DR2 and extend in the first direction DR1. The third pattern P3 may extend in the second direction DR2 and connect the first pattern P1 and the second pattern P2.

The flexible circuit board according to the exemplary embodiment may include the floating patterns spaced apart from the pads connected to the display panel. Thus, when the flexible circuit board is compressed through the ACF, the adhesive resin contained in the ACF is evenly distributed on the flexible circuit board to prevent or suppress the flexible circuit board from being delaminated even when bent.

Therefore, the display device having improved reliability may be provided.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel comprising a plurality of display pads each extending in a first direction and arranged in a second direction crossing the first direction;
   a main circuit board; and
   a flexible circuit board connected to the display panel by an anisotropic conductive film (ACF) comprising:
   board pads connected to the display pads; and
   a floating pattern electrically insulated from the display pads and spaced apart from the board pads,
   wherein at least a portion of the floating pattern does not overlap with the ACF in plan view,
   wherein the floating pattern has a length in the first direction equal to or greater than 200 μm and equal to or smaller than 250 μm.

2. The display device of claim 1, wherein the display panel comprises a dummy pattern, the dummy pattern connected to the floating pattern, and
   the floating pattern has a length in the first direction, which is greater than a length of the dummy pattern in the first direction.

3. The display device of claim 1, wherein the floating pattern is provided in plurality, and
   a distance between adjacent floating patterns in the second direction is about 50 μm.

4. The display device of claim 3, wherein the floating patterns each extend in the first direction and are arranged in the second direction.

5. The display device of claim 3, wherein the floating patterns each extend in the second direction and are arranged in the first direction.

6. The display device of claim 1, wherein the flexible circuit board comprises:
   a first edge extending in the second direction and overlapping the display panel; and
   a second edge extending in the first direction and connected to the first edge, and
   wherein a spaced distance between the first edge and the floating pattern in the first direction is about 50 μm.

7. The display device of claim 6, wherein a spaced distance from the second edge to the floating pattern is equal to or greater than 90 μm and equal to or smaller than 100 μm.

8. The display device of claim 1, wherein the floating pattern comprises:
   a first pattern extending in the first direction;
   a second pattern spaced apart from the first pattern in the first direction and the second direction; and
   a third pattern connecting the first pattern and the second pattern.

9. A display device of comprising:
   a display panel comprising a plurality of display pads each extending in a first direction and arranged in a second direction crossing the first direction;
   a main circuit board; and
   a flexible circuit board connected to the display panel by an anisotropic conductive film (ACF) comprising:
   board pads connected to the display pads; and
   a floating pattern electrically insulated from the display pads and spaced apart from the board pads,
   wherein at least a portion of the floating pattern does not overlap with the ACF in plan view,
   wherein the floating pattern has a width in the second direction equal to or greater than 25 μm and equal to or smaller than 75 μm.

10. A display device comprising:
    a display panel comprising:
    a plurality of display pads each extending in a first direction and arranged in a second direction crossing the first direction; and
    a dummy pattern spaced apart from the display pads;
    a main circuit board; and
    a flexible circuit board comprising:
    board pads connected to the display pads; and
    a floating pattern electrically insulated from the display pads and connected to the dummy pattern,
    wherein the floating pattern has a length in the first direction, which is greater than a length of the dummy pattern in the first direction,
    wherein the length of the floating pattern in the first direction is equal to or greater than 200 μm and equal to or small than 250 μm.

11. The display device of claim 10, wherein the display panel and the flexible circuit board are connected by an anisotropic conductive film (ACF), and
    wherein at least a portion of the floating pattern does not overlap with the ACF in a plan view.

12. The display device of claim 10, wherein a width of the floating pattern in the second direction is equal to or greater than 25 μm and equal to or small than 75 μm.

13. The display device of claim 10, wherein the floating pattern is provided in plurality, and
    a distance between adjacent floating patterns in the second direction is about 50 μm.

14. The display device of claim 13, wherein the floating patterns each extend in the first direction and are arranged in the second direction.

15. The display device of claim 13, wherein the floating patterns each extend in the second direction and are arranged in the first direction.

16. The display device of claim 10, wherein the flexible circuit board comprises:
    a first edge extending in the second direction, the first edge overlapping the display panel; and
    a second edge extending in the first direction and connected to the first edge, and
    wherein a spaced distance between the first edge and the floating pattern in the first direction is about 50 μm.

17. The display device of claim 16, wherein a spaced distance from the second edge to the floating pattern is equal to or greater than 90 μm and equal to or smaller than 100 μm.

18. The display device of claim 10, wherein the floating pattern comprises:

a first pattern extending in the first direction;
a second pattern spaced apart from the first pattern in the first direction and the second direction; and
a third pattern connecting the first pattern and the second pattern.

\* \* \* \* \*